US012755796B2

(12) United States Patent
Chou et al.

(10) Patent No.: US 12,755,796 B2
(45) Date of Patent: Oct. 6, 2026

(54) ERASE METHOD FOR MEMORY DEVICE AND MEMORY DEVICE

(71) Applicant: MACRONIX International Co., Ltd., Hsinchu (TW)

(72) Inventors: You-Liang Chou, Taichung City (TW); Wen-Jer Tsai, Hualien County (TW); Chih-Chieh Cheng, Hsinchu County (TW)

(73) Assignee: MACRONIX International Co., Ltd., Hsinchu (TW)

(*) Notice: Subject to any disclaimer, the term of this patent is extended or adjusted under 35 U.S.C. 154(b) by 234 days.

(21) Appl. No.: 18/762,246

(22) Filed: Jul. 2, 2024

(65) Prior Publication Data

US 2026/0011377 A1 Jan. 8, 2026

(51) Int. Cl.
*G11C 16/16* (2006.01)
*G11C 16/26* (2006.01)
*G11C 16/04* (2006.01)

(52) U.S. Cl.
CPC .............. *G11C 16/16* (2013.01); *G11C 16/26* (2013.01); *G11C 16/0483* (2013.01)

(58) Field of Classification Search
None
See application file for complete search history.

(56) References Cited

U.S. PATENT DOCUMENTS

2014/0126306 A1* 5/2014 Otterstedt ............ H04L 9/3263 365/189.07
2016/0141043 A1* 5/2016 Lee ........................ G11C 16/08 365/185.11
2022/0319608 A1* 10/2022 Mun ...................... G11C 16/16

OTHER PUBLICATIONS

Yosuke Komori et al., "Disturbless Flash Memory due to High Boost Efficiency on BiCS Structure and Optimal Memory Film Stack for Ultra High Density Storage Device", 2008 IEEE International Electron Devices Meeting, Feb. 2009, pp. 1-4.
Akira Goda, "Recent Progress on 3D NAND Flash Technologies", Electronics, Dec. 2021, pp. 1-16.

* cited by examiner

*Primary Examiner* — Alfredo Bermudez Lozada
(74) *Attorney, Agent, or Firm* — J.C. PATENTS

(57) ABSTRACT

A memory erase method for a memory device and a memory device are provided. The memory device is a 3D NAND flash with high capacity and high performance. The memory erase method includes: providing a memory block, which comprises memory cell strings including first-part memory cells, dummy cells, and second-part memory cells, wherein the first-part memory cells on each memory string are constructed as first pages, and the second-part memory cells on each memory string are constructed as second pages; performing a program operation to one of the first pages and one of the second pages; performing a gate induced drain leakage (GIDL) erasing operation to the first pages; and, inhibiting the second pages and the dummy cells of each memory cell string while the GIDL erasing operation are performed.

18 Claims, 10 Drawing Sheets

ERASE METHOD FOR MEMORY DEVICE AND MEMORY DEVICE

BACKGROUND

Technical Field

The disclosure relates to a memory control technology applied to a memory device (e.g., NAND flash memory), and in particular relates to an erase method for a memory device and a memory device therefore.

Description of Related Art

Integrated circuit memory with high capacity and high performance, which includes 3D NAND flash memory, is continuously developing. It aims to increase data storage density by reducing the size of memory cells using 3D stacking technology and triple-level cells (TLC).

On the other hand, physically unclonable function (PUF) technology is based on process variability and material characteristics, which result in objects manufactured through semiconductor processes generating highly random and unpredictable data, and the PUF technology produces PUF data. The PUF data may be used for identity verification, device keys, communication security, and other purposes. The PUF data is unique for each integrated circuit memory.

The PUF technology in 3D flash memory may be implemented based on gate induced drain leakage (GIDL) erasing technology, but numbers of PUF data produced by the GIDL erasing technology are limited by the structure of the 3D flash memory.

SUMMARY

An erase method for a memory device and the memory device therefore are provided, so that an amount of the PUF data generated by the erase method can be increased.

The erase method of the memory device of the embodiment of the disclosure includes the following operation. A memory block is provided, in which the memory block comprises a plurality of the memory cell strings, the plurality of the memory cell strings including a plurality of the string selection transistors, a plurality of the first-part memory cells, a plurality of the dummy cells, a plurality of the second-part memory cells, and a plurality of the ground selection transistors, wherein each of the plurality of the string selection transistors, each of the plurality of the first-part memory cells, each of the plurality of the dummy cells, each of the plurality of the second-part memory cells, and each of the plurality of the ground selection transistors are connected in series to construct each memory cell string, each of the plurality of the dummy cells are disposed between one of the plurality of the first-part memory cells and one of the plurality of the second-part memory cells, wherein the first-part memory cells on each memory string connected to a plurality of the first word lines respectively are constructed as a plurality of the first pages, and the second-part memory cells on each memory string connected to a plurality of the second word lines are constructed as a plurality of the second pages. A program operation is performed to one of the plurality of the first pages as a selected first page. The program operation is performed to one of the plurality of the second pages as a selected second page. A gate induced drain leakage (GIDL) erasing operation is performed to the plurality of the first pages. The plurality of the second pages and the dummy cells of each memory cell string are inhibited while the GIDL erasing operation are performed to the plurality of the first pages. The GIDL erasing operation is performed to the plurality of the second pages. The plurality of the first pages and the dummy cells of each memory cell string are inhibited while the GIDL erasing operation are performed to the plurality of the second pages.

A memory device according to an embodiment of the disclosure includes a memory block and a memory controller. The memory block comprises a plurality of the memory cell strings, the plurality of the memory cell strings including a plurality of the string selection transistors, a plurality of the first-part memory cells, a plurality of the dummy cells, a plurality of the second-part memory cells, and a plurality of the ground selection transistors. Each of the plurality of the string selection transistors, each of the plurality of the first-part memory cells, each of the plurality of the dummy cells, each of the plurality of the second-part memory cells, and each of the plurality of the ground selection transistors are connected in series to construct each memory cell string. Each of the plurality of the dummy cells are disposed between one of the plurality of the first-part memory cells and one of the plurality of the second-part memory cells. The first-part memory cells on each memory string connected to a plurality of the first word lines respectively are constructed as a plurality of the first pages, and the second-part memory cells on each memory string connected to a plurality of the second word lines are constructed as a plurality of the second pages. The memory controller is coupled to the memory block and the memory controller controls a plurality of voltage drivers to perform: performing a program operation to one of the plurality of the first pages as a selected first page; performing the program operation to one of the plurality of the second pages as a selected second page; performing a gate induced drain leakage (GIDL) erasing operation to the plurality of the first pages; inhibiting the plurality of the second pages and the dummy cells of each memory cell string while the GIDL erasing operation are performed to the plurality of the first pages; performing the GIDL erasing operation to the plurality of the second pages; and, inhibiting the plurality of the first pages and the dummy cells of each memory cell string while the GIDL erasing operation are performed to the plurality of the second pages.

Based on the above, the erase method for the memory device and the memory device described in the embodiment of the disclosure involves dividing the memory cell strings of the memory device into the first-part memory cells and the second-part memory cells based on the dummy cells. During the GIDL erasing operation performed on the first-part memory cells, the second-part memory cells and the dummy cells are inhibited, and, during the GIDL erasing operation performed on the second-part memory cells, the first-part memory cells and the dummy cells are inhibited. Thus, the erase method for the memory device of the disclosure described enables each memory cell string to generate two bit values in the PUF data, and the two bit values generated by the same memory cell string are uncorrelated to each other, thereby increasing the amount of PUF data bit values based on each memory cell string generated by the erase method.

DETAILED DESCRIPTION OF DISCLOSED EMBODIMENTS

Figure 1:
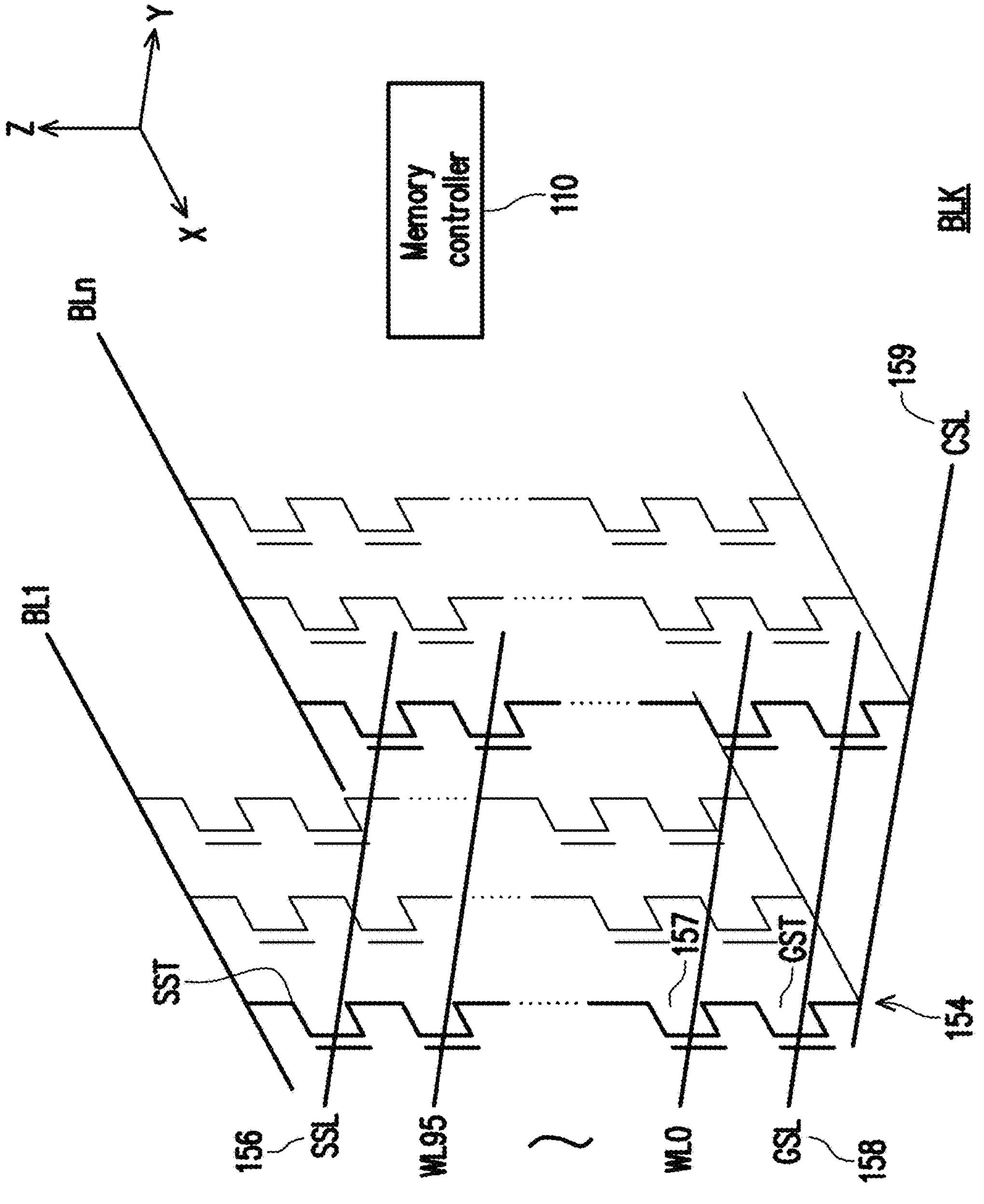
FIG. 1 is a structural schematic diagram of a memory block in a three-dimensional memory chip according to an embodiment of the disclosure.
Figure 2:
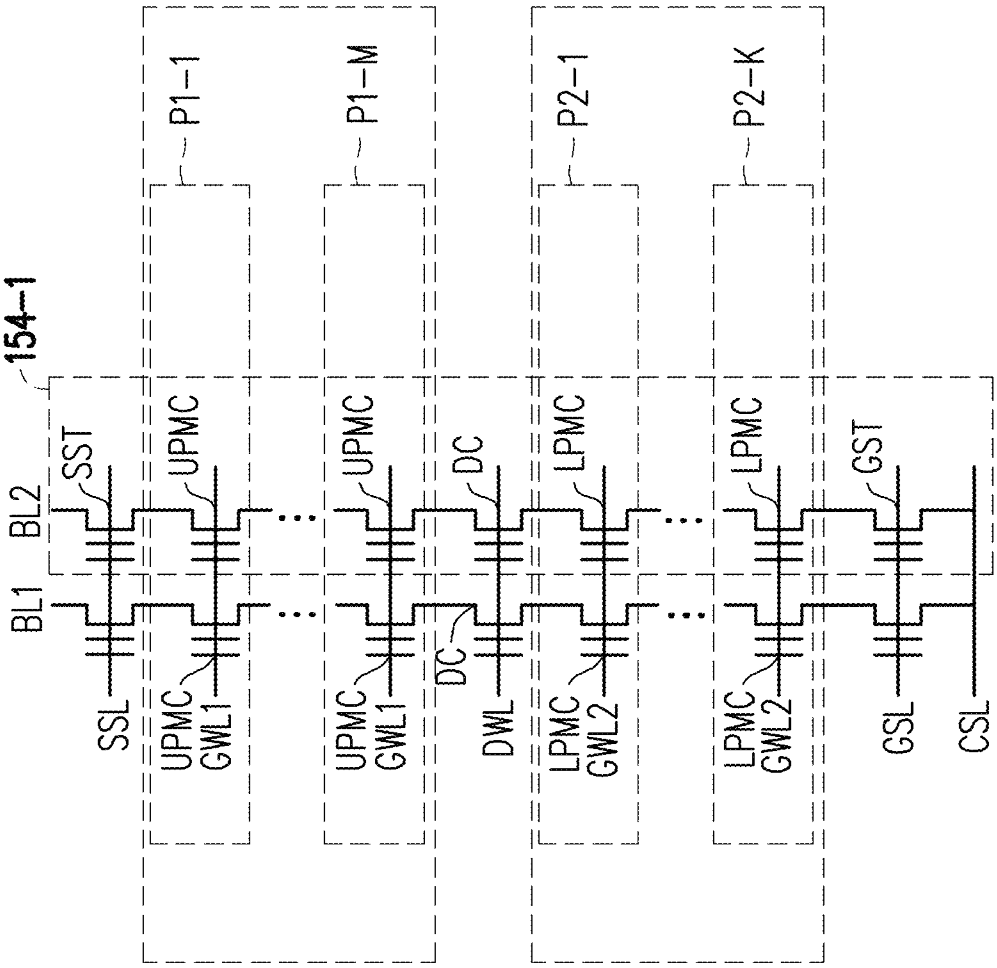
FIG. 2 is a schematic diagram of pages of the memory block according to an embodiment of the present invention.

FIG. 1 is a structural schematic diagram of a memory block BLK in a three-dimensional memory chip according to an embodiment of the disclosure. FIG. 2 is a schematic diagram of pages, such as pages P1-1 to P1-M and P2-1 to P2-K, of the memory block BLK according to an embodiment of the present invention. Please refer to FIG. 1 and FIG. 2 simultaneously, the three-dimensional memory chip may include one or more memory blocks BLK. Multiple memory cells in the memory block BLK are configured in three dimensions, for example, an XYZ coordinate system. Taking the memory cell 157 of FIG. 1 as an example, the memory cell 157 is coupled to the corresponding word line WL0 and bit line BL1.

The word lines (e.g., word lines WL0 to WL95) formed by the conductive layers or the word line layers and the memory cells coupled thereto form multiple pages. For example, each page can consist of multiple memory cells arranged in the XY plane, and memory cells of one page are connected to the same word line.

In FIG. 2, the memory block BLK comprises pages P1-1 to P1-M and P2-1 to P2-K. The memory cells on the same layer (the same page) may be coupled to a same word line (e.g., a word line WL0 or WL95 in FIG. 1) and obtain a same corresponding word line voltage. The memory cells on the different layers (different pages) may be coupled to different word lines (e.g., word lines WL0 and WL95 in FIG. 1) and obtain different corresponding word line voltages. In other words, one page in the memory block 150 is constructed by the memory cells which are connected with one of the word lines (for instance, one of word lines WL0-WL95 in FIG. 1) on the memory cell strings. Each of the pages may be connected to corresponding contacts in a driver circuit through one of the word lines WL0-WL95 in FIG. 1 coupling with this page, for example to an X decoder (or knowns as a scan driver). Each line has a corresponding voltage driver, and these voltage drivers may be controlled by the memory controller 110 or corresponding hardware. Memory cells in the memory cell string 154 belong to different pages.

Each memory cell string (e.g., the string 154) includes multiple memory cells connected in series vertically along the Z direction. In FIG. 1, the memory cell strings include a plurality of memory cells (e.g., the memory cell 157), a plurality of string selection transistors SST coupled to a string selection line (SSL) 156 and a plurality of ground selection transistors GST coupled to a ground selection line (GSL) 158. The string 154 is connected to one or more drivers, such as data drivers. The memory cell 157 is connected to a common source line (CSL) 159 via a ground select transistor GST. The SSL 156 may be a conductive line or conductive layer formed on top of each page 152 (or word line layer). The memory block 150 may include multiple SSLs 156 provided on a top page of the pages 152. The GSL 158 may be a conductive line or conductive layer formed on the bottom of each page 152 (or word line layer). The CSL 159 may be a conductive layer or multiple conductive lines formed under the ground selection line (GSL) 158 and over the substrate of the three-dimensional memory chip. Several dummy lines or corresponding layers (not shown) may also be provided between the string selection line SSL 156 and the topmost page 152, or between the ground selection line GSL 158 and the bottommost page 152.

In the embodiment, memory cells in the memory block BLK can belong to either a single-level cell (SLC) type or a multi-layer memory cell type. The multi-layer memory cell type may be one of a multi-level cell (MLC) type, a triple-level cell (TLC) type, or a quadruple-level cell (QLC) type. In other words, the erase method of the memory device in the embodiments of the present invention do not limit the data storage types of memory cells in the memory device. In this embodiment, the memory cells in the memory device and the memory block BLK are exemplified using the TLC type.

In the embodiment of the disclosure, the PUF data is generated based on the memory device of FIG. 1 and FIG. 2 by a gate induced drain leakage (GIDL) erasing operation, a memory structure of the memory device has a plurality of memory cell string, and each of which is divided into two parts of memory cells (e.g., first-part memory cells and second-part memory cells of FIG. 2) with a dummy cell. The gate induced drain leakage (GIDL) erasing operation is based on process variability to generate PUF data of the memory device. In detail, one bit value of the PUF data according to the first-part memory cells of each memory cell string while the GIDL erasing operation is performed to the first page of the first-part memory cells, and another bit value of the PUF data according to the second-part memory cells of each memory cell string while the GIDL erasing operation is performed to the second page of the first-part memory cells. The two bit values generated by the first-part memory cells and the second-part memory cells in one memory cell string are uncorrelated to each other.

The memory device includes a memory array and a memory controller 110 of FIG. 1. The memory array may include one or more memory block BLK of FIG. 1. The memory block BLK of FIG. 1 includes a plurality of memory cell strings. In FIG. 2, take a memory cell string 154-1 as example, each of the memory cell string including a string selection transistors SST, a plurality of first-part memory cells UPMC, a dummy cell DC, a plurality of second-part memory cells LPMC, and a ground selection transistors GST. In other words, the string selection transistor SST, the first-part memory cells UPMC, the dummy cell DC, the second-part memory cells LPMC, and the ground selection transistor GST are connected in series to construct each memory cell string, for example, the memory cell string 154-1. The dummy cell DC is disposed between the first-part memory cells UPMC and the second-part memory cells LPMC.

In FIG. 2, the dummy cells DC on each memory string are connected to a dummy word line DWL. The plurality of the string selection transistors SST are connected to a string selection line SSL. The plurality of the ground selection transistors GST are connected to a ground selection line GSL. Each memory cell string is coupled to a corresponding bit line BLn through a corresponding string selection transistor SST. Each memory cell string is coupled to a common source line CSL through a corresponding ground selection transistor GST.

The first-part memory cells UPMC on each memory string connected to a plurality of first word lines (e.g., word lines GWL1 in FIG. 2) respectively are constructed as a plurality of first pages (e.g., first pages P1-1 to P1-M in FIG. 2). The second-part memory cells LPMC on each memory string connected to a plurality of second word lines (e.g., word lines GWL2 in FIG. 2) are constructed as a plurality of second pages (e.g., second pages P2-1 to P2-K in FIG. 2). The constants M and K are positive integers.

Figure 3:
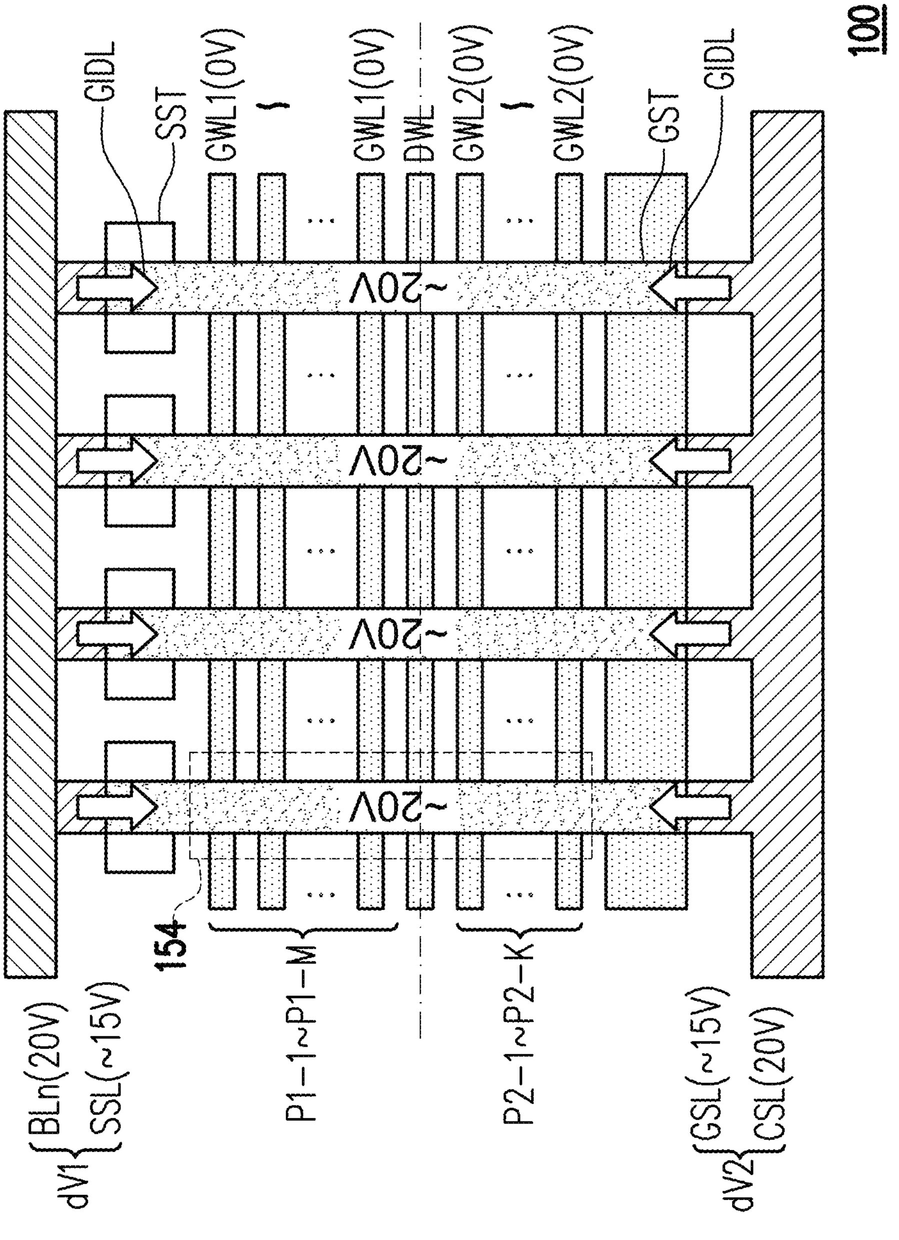
FIG. 3 is a schematic diagram of a gate induced drain leakage (GIDL) erasing method according to an embodiment of the disclosure.

FIG. 3 is a schematic diagram of a gate induced drain leakage (GIDL) erasing method according to an embodiment of the disclosure. FIG. 3 shows some components of FIG. 1 and FIG. 2 to illustrate the GIDL erasing method, the first word lines GWL1 which are disposed to the first pages P1-1 to P1-M, the dummy word line DWL which is disposed to the dummy cells DC, and the second word lines GWL2 which are disposed to the second pages P1-1 to P1-M. As shown in FIG. 3, the memory block BLK may use the GIDL erasing method to set all memory cells to logic "1". The GIDL erasing method is an erasing method performed on memory cells by using the string selection transistor SST and/or the ground selection transistor GST formed by doping technology to adjust the threshold voltage of each memory cell through corresponding hole flow generated by the voltage difference between the bit line BLn and the string selection line SSL (e.g., the voltage difference dV1 in FIG. 3A) and/or the voltage difference between the ground selection line GSL and the common source line CSL (e.g., the voltage difference dV2 in FIG. 3).

The GIDL erasing method is implemented through the string selection transistor SST and/or the ground selection transistor GST formed by doping technology. The doping condition of the string selection transistor SST and/or the ground selection transistor GST is slightly different due to the influence of semiconductor process variability, thereby the aforementioned voltage difference dV1 or dV2 affects the threshold voltage distribution in the memory cell.

Figure 4:
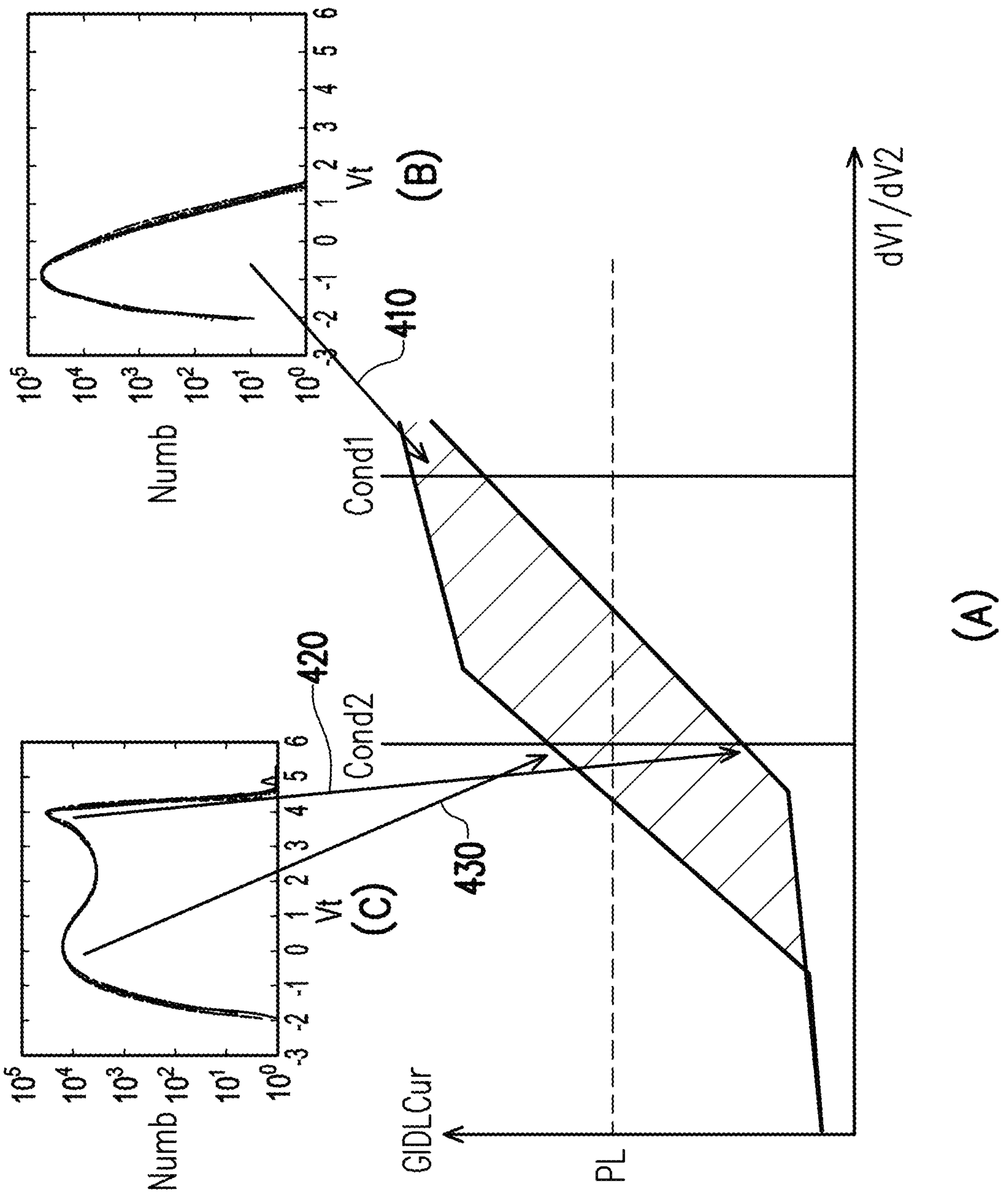
FIG. 4 is a schematic diagram of the influence of generated holes owing to GIDL on the threshold voltage distribution in a memory cell according to an embodiment of the disclosure.

FIG. 4 is a schematic diagram of the influence of generated holes owing to GIDL on the threshold voltage distribution in a memory cell according to an embodiment of the disclosure. The GIDLCur marked on the Y-axis in the graph (A) of FIG. 4 indicates the current value of the specific memory cell string subjected to the GIDL erasing method, and the value PL on the Y-axis indicates a standard that is sufficient as the GIDL erasing method. A current value of the GIDL erasing method lower than the value PL indicates that the memory cell has failed in performing the GIDL erasing method; a current of the GIDL erasing method higher than the value PL indicates that the memory cell is successful in performing the GIDL erasing method. The dV1/dV2 marked on the X-axis in the central graph of FIG. 4 indicates the voltage difference dV1 between the bit line BLn and the string selection line SSL or the voltage difference dV2 between the ground selection line GSL and the common source line CSL. Graph (B) and graph (C) in FIG. 4 respectively show the memory cell number Numb and the corresponding threshold voltage Vt distribution when the voltage difference dV1/dV2 is under condition Cond1 or condition Cond2. The condition Cond1 may also be referred to as a strong erasing condition, which has a larger voltage difference dV1/dV2; the condition Cond2 may also be referred to as a weak erasing condition, which has a smaller voltage difference dV1/dV2. Moreover, in this embodiment, the voltage difference dV1/dV2 of the condition Cond2 as shown in graph (C) of FIG. 4 is approximately less than 5V, so it is also referred to as the GIDL erasing method with a lack of enough current.

It may be known from FIG. 4 that in the normal GIDL erasing method, a larger voltage difference dV1/dV2 is provided (e.g., the condition Cond1), so that the memory cell number Numb and the corresponding threshold voltage Vt distribution in the memory cell are distributed on a specific convex curve, as shown in the graph (B) of FIG. 4, so that each erased memory cell has a similar threshold voltage, as shown by arrow 410. On the other hand, in the embodiment of the disclosure, a smaller voltage difference dV1/dV2 is provided (e.g., the condition Cond2), so that the memory cell number Numb and the corresponding threshold voltage Vt distribution in the memory cell have two peaks, as shown in the graph (C) of FIG. 4. The first peak of the graph (C) in FIG. 4 indicates the memory cell corresponding to the current value of the GIDL erasing method higher than the value PL (referred to as a strong erasing memory cell), as shown by the arrow 430. The second peak of the graph (C) in FIG. 4 indicates the memory cell corresponding to the current value of the GIDL erasing method lower than the value PL (referred to as a weak erasing memory cell), as shown by the arrow 420.

In other words, in this embodiment of the disclosure, the GIDL erasing method is utilized with the voltage difference dV1 between the bit line BL and the string selection line SSL or the voltage difference dV2 between the ground selection line GSL and the common source line CSL to provide corresponding voltage difference value according to the condition Cond2 in the graph (C) of FIG. 4, so that the memory cell presents the threshold voltage distribution in the graph (C) of FIG. 4. The memory cells are randomly classified into strong erasing memory cells and weak erasing memory cells according to the threshold voltage distribution of the memory cells. The strong erasing memory cells are set as the type-1 erase bit (e.g., bit logic "1"), the weak erasing memory cells are set as the type-2 erase bit (e.g., bit logic "0"), and thereby the PUF data generated by the influence of process variability is obtained. All memory cells in each memory cell string present the same type of memory cell. For example, as long as one memory cell in the specific memory cell string is measured as a strong erasing memory cell, the other memory cells in this specific memory cell string are also strong erasing memory cells. As long as one memory cell in the specific memory cell string is measured as a weak erasing memory cell, the other memory cells in this specific memory cell string are also weak erasing memory cells.

This embodiment of the disclosure is based on dummy cells to divide each memory cell string into first-part memory cells and second-part memory cells, and to perform PUF operations on each of the first-part memory cells and second-part memory cells separately. When the PUF operation on the first-part memory cells are performed, the second-part memory cells and the dummy cell of the same memory cell string are inhibited simultaneously. On the other hand, when the PUF operation on the second-part memory cells are performed, the first-part memory cells and the dummy cell of the same memory cell string are inhibited simultaneously. The two PUF operations on first-part memory cells and second-part memory cells do not performed simultaneously. Thus, the erase method for the memory device of the disclosure described enables each memory cell string to generate two bit values in the PUF data, and the two bit values generated by the same memory cell string are uncorrelated to each other, thereby increasing the amount of PUF data bit values based on each memory cell string generated by the erase method.

Figure 5:
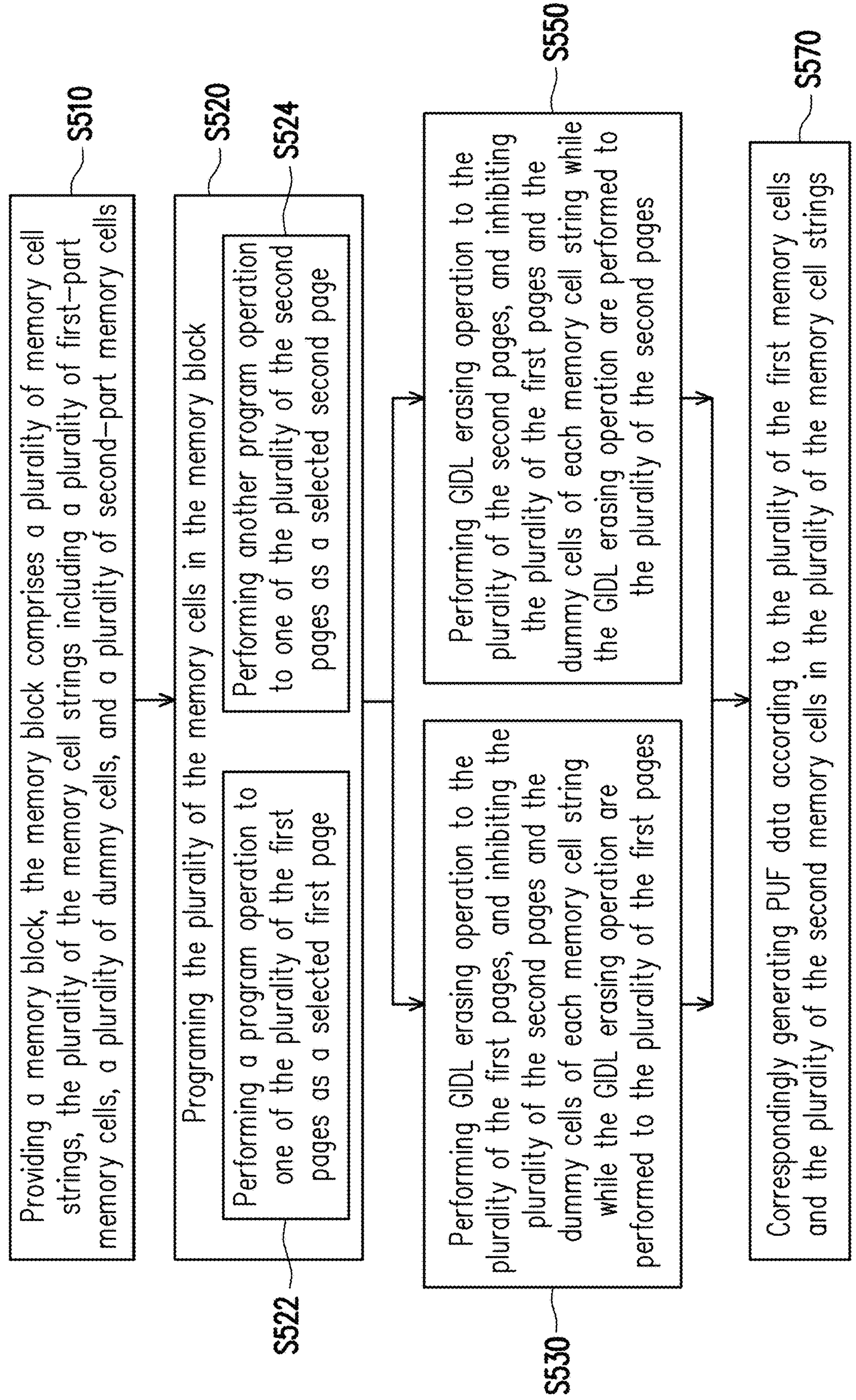
FIG. 5 is a flowchart of an erase method of a memory device according to an embodiment of the disclosure, which is also a flowchart of a data generating method of a physically unclonable function (PUF) in an embodiment of the disclosure.

FIG. 5 is a flowchart of an erase method of a memory device according to an embodiment of the disclosure, which is also a flowchart of a data generating method of a physically unclonable function (PUF) in an embodiment of the disclosure. The erase method in FIG. 5 is applicable to the memory block structures in FIG. 1 and FIG. 2, and may be implemented by a memory controller 110 of FIG. 1 or corresponding hardware.

In step S510, a memory block (e.g., a memory block with one or more memory block BLK in FIG. 1) is provided. Please refer to FIG. 2, the memory block 150 includes a plurality of memory cell strings (e.g., the memory cell string 154-1). The plurality of the memory cell strings including a plurality of string selection transistors (e.g., the string selection transistors SST), a plurality of first-part memory cells (e.g., the first-part memory cells UPMC), a plurality of dummy cells (e.g., the dummy cells DC), a plurality of second-part memory cells (e.g., the second-part memory cells UPMC), and a plurality of ground selection transistors (e.g., the ground selection transistors LPMC). Each of the plurality of the string selection transistors SST, each of the plurality of the first-part memory cells UPMC, each of the plurality of the dummy cells DC, each of the plurality of the second-part memory cells LPMC, and each of the plurality of the ground selection transistors GST are connected in series to construct each memory cell string (e.g., the memory cell string 154-1). Each of the plurality of the dummy cells DC are disposed between one of the plurality of the first-part memory cells UPMC and one of the plurality of the second-part memory cells LPMC. The first-part memory cells UPMC on each memory string connected to a plurality of first word lines GWL1 respectively are constructed as a plurality of first pages (e.g., the first pages P1-1~P1-M), and the second-part memory cells LPMC on each memory string connected to a plurality of second word lines GWL2 are constructed as a plurality of second pages (e.g., the second pages P2-1~P2-K).

Back to FIG. 5, in step S520, the memory controller 110 of FIG. 1 may program the plurality of the memory cells in the memory block. This embodiment adopts page programming. In the embodiment of the disclosure, the memory controller 110 of FIG. 1 at least performs one program operation to one of the plurality of the first pages as a selected first page (step S522), and performs another program operation to one of the plurality of the second pages as a selected second page (step S524). In other words, the step S520 is to reset these memory cells in the selected first page and the selected second page, and memory cells of the selected first page and memory cells of the selected second page may have the same threshold voltage distribution for preparing next steps for generating PUF data.

Figure 6:
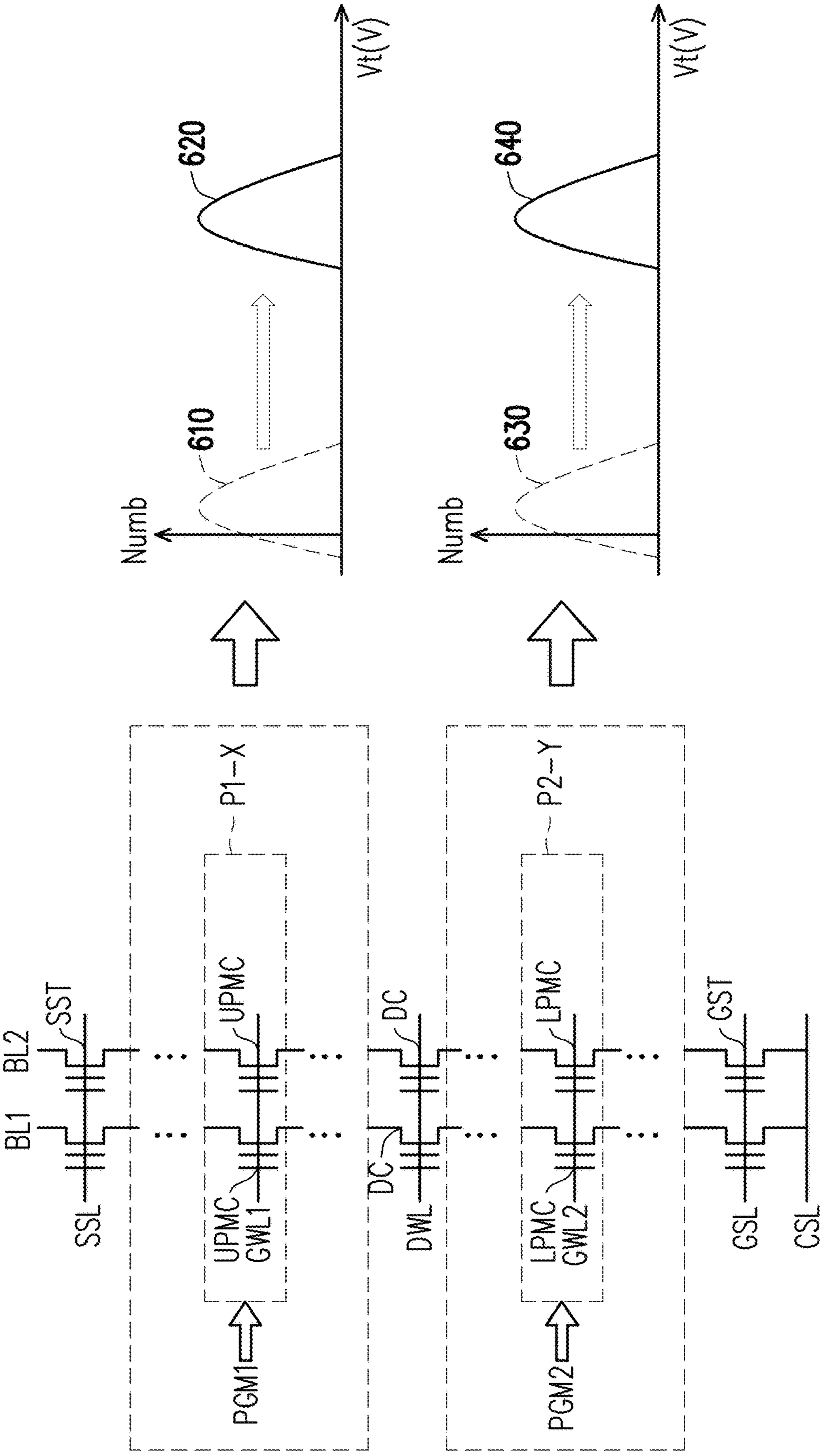
FIG. 6 is a schematic diagram with a portion of memory cell strings in the memory block and threshold voltage distributions thereof for steps S522 and S524 in FIG. 5 according to an embodiment of the disclosure.

FIG. 6 is a schematic diagram with a portion of memory cell strings in the memory block and threshold voltage distributions thereof for steps S522 and S524 in FIG. 5 according to an embodiment of the disclosure. Please refer to FIG. 6, the memory controller 110 of FIG. 1 performs the program operation PGM1 to one of the plurality of the first pages as a selected first page (e.g., a selected first page P1-X) (step S522), thus threshold voltages of memory cells in the selected first page P1-X (shown on the threshold voltage distribution curve 610 in FIG. 6) are programed to an initial threshold voltage (shown on the threshold voltage distribution curve 620 in FIG. 6). And, the memory controller 110 of FIG. 1 performs the program operation PGM2 to one of the plurality of the second pages as a selected second page (e.g., a selected second page P2-Y) (step S524), thus threshold voltages of memory cells in the selected second page P2-Y (shown on the threshold voltage distribution curve 630 in FIG. 6) are programed to an initial threshold voltage (shown on the threshold voltage distribution curve 640 in FIG. 6).

Back to FIG. 5, in step S530, the memory controller 110 of FIG. 1 performs a first GIDL erasing operation to the plurality of the first pages P1-1~P1-M, and the memory controller 110 of FIG. 1 inhibits the plurality of the second pages P2-1~P2-K and the dummy cells DC of each memory cell string while the first GIDL erasing operation are performed to the plurality of the first pages P1-1~P1-M. In other words, the step S530 is to generate a first portion of the PUF data according to the first pages P1-1~P1-M, and to inhibit the second pages P2-1~P2-K and the dummy cells DC at the same time for avoiding memory cells of the second pages P2-1~P2-K and the dummy cells DC being affected by the first GIDL erasing operation.

Figure 7:
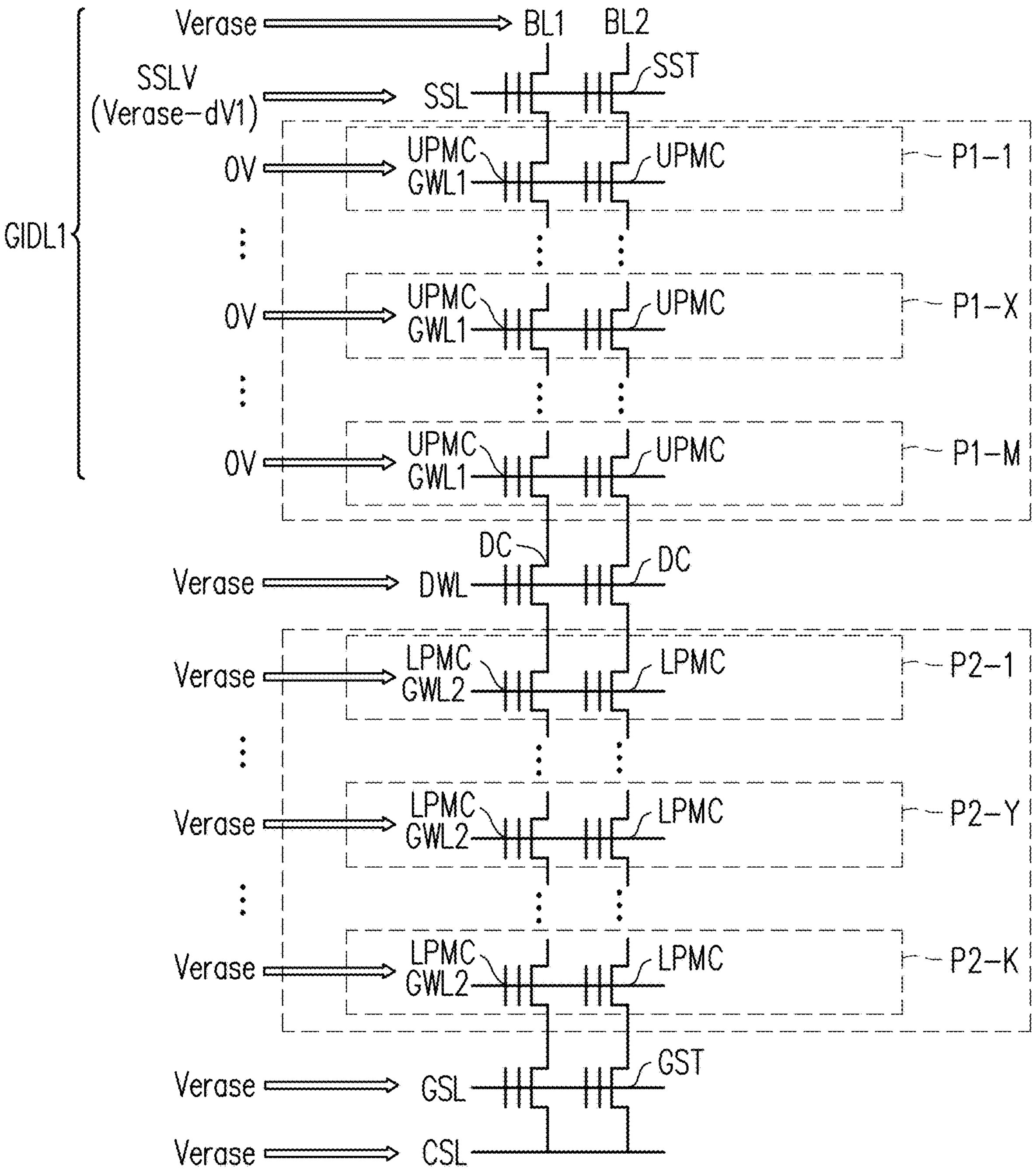
FIG. 7 is a schematic diagram of a portion of memory cell strings in the memory block for the step S530 in FIG. 5 according to an embodiment of the disclosure.

FIG. 7 is a schematic diagram of a portion of memory cell strings in the memory block for the step S530 in FIG. 5 according to an embodiment of the disclosure. Please refer to FIG. 7, the memory controller 110 of FIG. 1 performs the first GIDL erasing operation GIDL1 to the plurality of the first pages P1-1~P1-M. In detail, an erase voltage Verase is applied to bit lines (e.g., bit lines BL1, BL2 . . . ). A string selection line erase voltage SSLV is applied to the string selection line SSL, and a voltage difference dV1 between the erase voltage Verase and the string selection line erase voltage SSLV is less than or equal to a predetermined voltage difference. The predetermined voltage difference ranges from 0 volt to 5 volts. A word line erase voltage (e.g., 0V) is applied to the first word lines GWL1.

The memory controller 110 of FIG. 1 inhibits the second pages P2-1~P2-K and the dummy cells DC of each memory cell string while the GIDL erasing operation are performed to the plurality of the first pages P1-1~P1-M. In detail of FIG. 7, the erase voltage Verase is applied to the dummy word line DWL, the plurality of the second word lines GWL2, the ground selection line GSL, and the common source line CSL.

Figure 8:
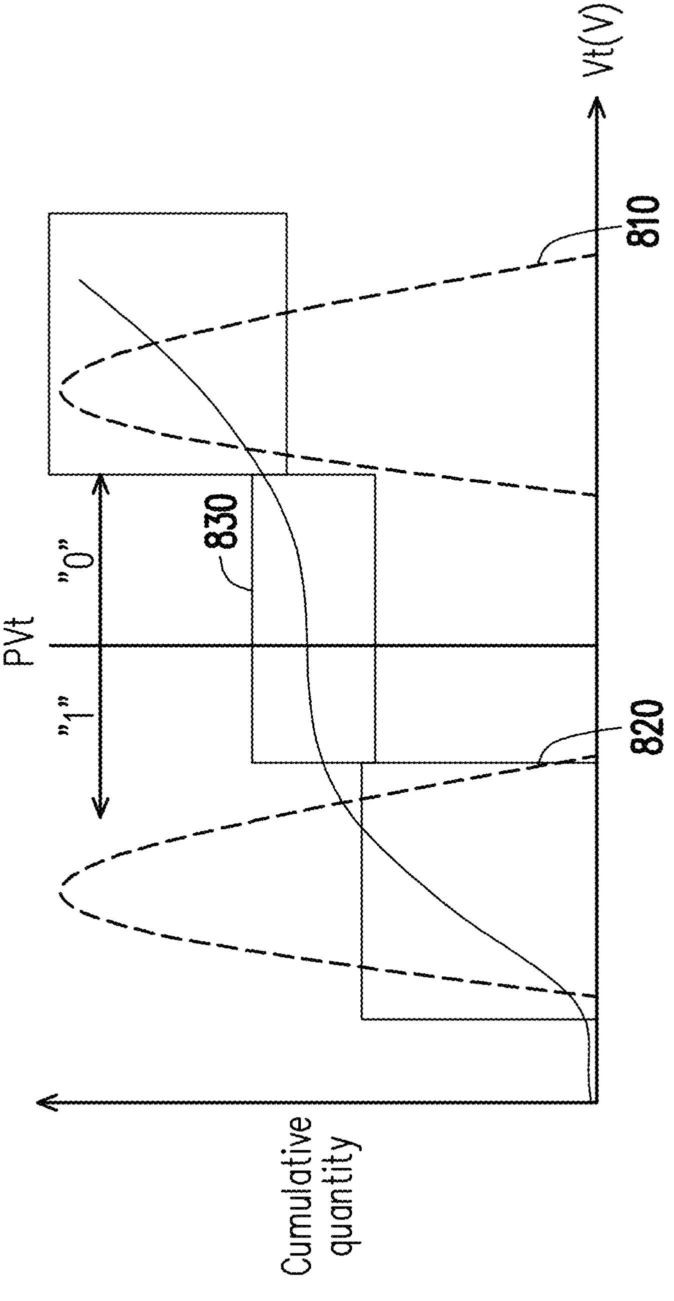
FIG. 8 is a schematic diagram of threshold voltage distributions of memory cells in the selected first page after the first GIDL erasing operation according to an embodiment of the disclosure.

FIG. 8 is a schematic diagram of threshold voltage distributions of memory cells in the selected first page P1-X after the first GIDL erasing operation according to an embodiment of the disclosure. The Y-axis in FIG. 8 represents the cumulative quantity of memory cells in the selected first page P1-X, the X-axis in FIG. 8 represents the threshold voltage of the memory cells in the selected first page P1-X, the convex dashed line 810 represents the threshold voltage distribution of the weak erasing memory cells, and the convex dashed line 820 represents the threshold voltage distribution of the strong erasing memory cells. As for the selected first page P1-X, the first-part memory cells in the selected first page P1-X may use the predetermined threshold voltage value PVt in FIG. 8 to distinguish the corresponding memory cell as a strong erasing memory cell (corresponding to logic "1") or a weak erasing memory cell (corresponding to logic "0"). If the threshold voltage of one memory cell in the selected first page P1-X is located at the box marked by the arrow 830, it indicates that the threshold voltage value corresponding to the memory cells are in an unstable memory cell range, and the embodiment of the disclosure may filter out such memory cells and ignores them, and does not use the memory cells in the selected first page P1-X to generate PUF data.

Figure 9:
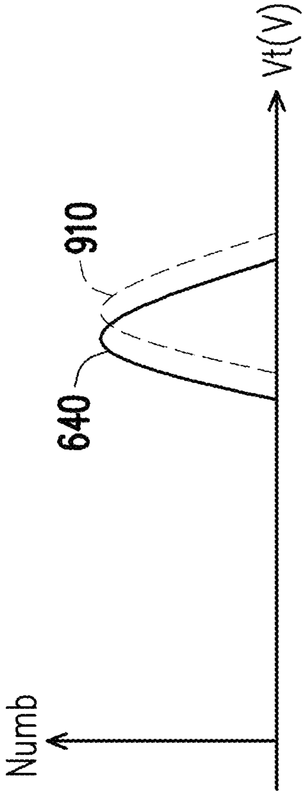
FIG. 9 is a schematic diagram of threshold voltage distributions of memory cells in the second pages and the dummy cells DC according to an embodiment of the disclosure.

FIG. 9 is a schematic diagram of threshold voltage distributions of memory cells in the second pages P2-1~P2-K and the dummy cells DC according to an embodiment of the disclosure. The threshold voltage distribution curve 640 in FIG. 6 and FIG. 9 are the threshold voltages of memory cells in the selected second page P2-Y and the dummy cells DC after step S520. While in step S530, although the selected second page P2-Y and the dummy cells DC are inhibited, the threshold voltages of memory cells in the selected second page P2-Y and the dummy cells DC may be affected slightly by the GIDL erasing operation, thus the threshold voltage distribution curve 640 in FIG. 9 may be moved to the threshold voltage distribution curve 910 in FIG. 9.

Back to FIG. 5, in step S550, the memory controller 110 of FIG. 1 performs a second GIDL erasing operation to the plurality of the second pages P2-1~P2-K, and the memory controller 110 of FIG. 1 inhibits the plurality of the first pages P1-1~P1-K and the dummy cells DC of each memory cell string while the second GIDL erasing operation are performed to the plurality of the second pages P2-1~P2-K. In other words, the step S550 is to generate a second portion of the PUF data according to the second pages P2-1~P2-K, and to inhibit the first pages P1-1~P1-M and the dummy cells DC at the same time for avoiding memory cells of the first pages P1-1~P1-M and the dummy cells DC being affected by the second GIDL erasing operation.

Figure 10:
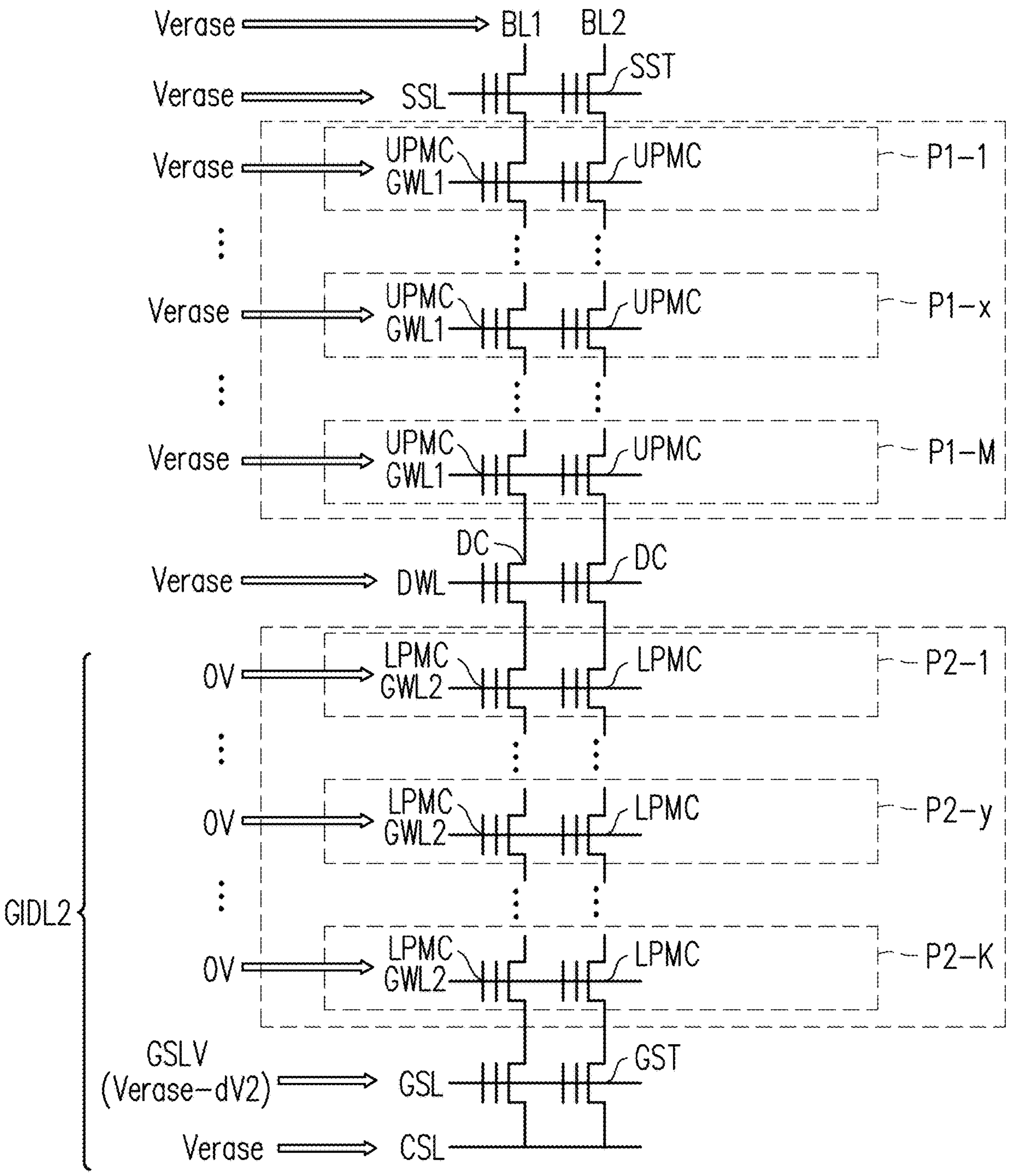
FIG. 10 is a schematic diagram of a portion of memory cell strings in the memory block for the step S550 in FIG. 5 according to an embodiment of the disclosure.

FIG. 10 is a schematic diagram of a portion of memory cell strings in the memory block for the step S550 in FIG. 5 according to an embodiment of the disclosure. Please refer to FIG. 10, the memory controller 110 of FIG. 1 performs the second GIDL erasing operation GIDL2 to the plurality of the second pages P2-1~P2-K. In detail, the erase voltage Verase is applied to the common source line CSL. A ground selection line erase voltage GSLV is applied to the ground selection line GSL, and a voltage difference dV2 between the erase voltage Verase and the ground selection line erase voltage GSLV is less than or equal to the predetermined voltage difference. The predetermined voltage difference ranges from 0 volt to 5 volts. A word line erase voltage (e.g., 0V) is applied to the second word lines GWL2.

The memory controller 110 of FIG. 1 inhibits the first pages P1-1~P1-M and the dummy cells DC of each memory cell string while the GIDL erasing operation are performed to the plurality of the second pages P2-1~P2-K. In detail of FIG. 10, the erase voltage Verase is applied to the dummy word line DWL, the plurality of the first word lines GWL1, the string selection line SSL, and the bit lines (e.g., bit lines BL1, BL2 . . . ) while the second GIDL erasing operation GIDL2 are performed to the plurality of the second pages P2-1~P2-K.

After the step S550, the threshold voltage distributions of memory cells in the selected second page P2-Y after the second GIDL erasing operation may the same as the threshold voltage distributions of memory cells in the selected second page P1-X in FIG. 8. And, the threshold voltage distributions of memory cells in the second pages P1-1~P1-M (shown in FIG. 8) may be affected slightly by the second GIDL erasing operation in step S550, but the threshold voltage distributions of memory cells in the second pages P1-1~P1-M is nearly unchanged. The threshold voltage distributions of the dummy cells DC may be the same as the threshold voltage distributions 910 in FIG. 9.

Back to FIG. 5, in step S570, the memory controller 110 of FIG. 1 generates physically unclonable function (PUF) data according to the plurality of the first memory cells UPMC and the plurality of the second memory cells LPMC randomly classified into the type-1 erase bit or the type-2 erase bit in the plurality of the memory cell strings. In detail, after the first GIDL operation to the plurality of the first pages P1-1~P1-M and the second GIDL operation to the plurality of the second pages P2-1~P2-M, all the first memory cells UPMC in a specific memory cell string are the type-1 erase bit or the type-2 erase bit, all the second memory cells LPMC in the specific memory cell string are the type-1 erase bit or the type-2 erase bit.

The memory controller 110 of FIG. 1 performs a first read operation to the selected first page P1-X to obtain a first portion of the PUF data as a first PUF data, and performs a second read operation to the selected second page P2-Y to obtain a second portion of the PUF data as a second PUF data. In some embodiments of the disclosure, the memory controller 110 of FIG. 1 may firstly performs the first GIDL erase operation in step S530, then performs the first read operation after the first GIDL erase operation. And, secondly, the memory controller 110 of FIG. 1 may performs the second GIDL erase operation in step S550, then performs the second read operation after the second GIDL erase operation.

The erase bit type of the first memory cells UPMC and the erase bit type of the second memory cells LPMC has 0.5 inter-hamming distance. In other words, the erase method for the memory device of the disclosure described enables each memory cell string to generate two bit values in the PUF data, one bit value is according to the first-part memory cell of each memory cell string, and another bit value is according to the second-part memory cell of each memory cell string. The two bit values generated by the same memory cell string are uncorrelated to each other.

To sum up, the erase method for the memory device and the memory device described in the embodiment of the disclosure involves dividing the memory cell strings of the memory device into the first-part memory cells and the second-part memory cells based on the dummy cells. During the GIDL erasing operation performed on the first-part memory cells, the second-part memory cells and the dummy cells are inhibited, and, during the GIDL erasing operation performed on the second-part memory cells, the first-part memory cells and the dummy cells are inhibited. Thus, the erase method for the memory device of the disclosure described enables each memory cell string to generate two bit values in the PUF data, and the two bit values generated by the same memory cell string are uncorrelated to each other, thereby increasing the amount of PUF data bit values based on each memory cell string generated by the erase method.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An erase method for a memory device, comprising:

providing a memory block, wherein the memory block comprises a plurality of memory cell strings, the plurality of the memory cell strings including a plurality of string selection transistors, a plurality of first-part memory cells, a plurality of dummy cells, a plurality of second-part memory cells, and a plurality of ground selection transistors, wherein each of the plurality of the string selection transistors, each of the plurality of the first-part memory cells, each of the plurality of the dummy cells, each of the plurality of the second-part memory cells, and each of the plurality of the ground selection transistors are connected in series to construct each memory cell string, each of the plurality of the dummy cells are disposed between one of the plurality of the first-part memory cells and one of the plurality of the second-part memory cells, wherein the first-part memory cells on each memory string connected to a plurality of first word lines respectively are constructed as a plurality of first pages, and the second-part memory cells on each memory string connected to a plurality of second word lines are constructed as a plurality of second pages; and performing a program operation to one of the plurality of the first pages as a selected first page;

performing the program operation to one of the plurality of the second pages as a selected second page;

performing a gate induced drain leakage (GIDL) erasing operation to the plurality of the first pages;

inhibiting the plurality of the second pages and the dummy cells of each memory cell string while the GIDL erasing operation are performed to the plurality of the first pages;

performing the GIDL erasing operation to the plurality of the second pages; and inhibiting the plurality of the first pages and the dummy cells of each memory cell string while the GIDL erasing operation are performed to the plurality of the second pages, wherein, after the GIDL operation to the plurality of the first pages and the GIDL operation to the plurality of the second pages, all the first memory cells in a specific memory cell string are the type-1 erase bit or the type-2 erase bit, all the second memory cells in the specific memory cell string are the type-1 erase bit or the type-2 erase bit, and an erase bit type of the first memory cells and an erase bit type of the second memory cells has 0.5 inter-hamming distance.

2. The erase method for the memory device according to claim 1, further comprising:

correspondingly generating physically unclonable function (PUF) data according to the plurality of the first memory cells and the plurality of the second memory cells randomly classified into the type-1 erase bit or the type-2 erase bit in the plurality of the memory cell strings.

3. The erase method for the memory device according to claim 1, further comprising:

performing a read operation to the selected first page to obtain a first PUF data; and performing the read operation to the selected second page to obtain a second PUF data.

4. The erase method for the memory device according to claim 1, wherein the dummy cells on each memory string are connected to a dummy word line, the plurality of the string selection transistors are connected to a string selection line, the plurality of the ground selection transistors are connected to a ground selection line, each memory cell string is coupled to a corresponding bit line through a corresponding string selection transistor, and, each memory cell string is coupled to a common source line through a corresponding ground selection transistor.

5. The erase method for the memory device according to claim 4, performing the GIDL erasing operation to the plurality of the first pages comprising:

applying an erase voltage to bit lines;

applying a string selection line erase voltage to the string selection line, wherein a voltage difference between the erase voltage and the string selection line erase voltage is less than or equal to a predetermined voltage difference; and applying a word line erase voltage to the first word lines.

6. The erase method for the memory device according to claim 5, wherein the predetermined voltage difference ranges from 0 volt to 5 volts.

7. The erase method for the memory device according to claim 4, performing the GIDL erasing operation to the plurality of the second pages comprising:

applying an erase voltage to the common source line;

applying a ground selection line erase voltage to the ground selection line, wherein a voltage difference between the erase voltage and the ground selection line erase voltage is less than or equal to a predetermined voltage difference; and applying a word line erase voltage to the second word lines.

8. The erase method for the memory device according to claim 4, inhibiting the second pages and the dummy cells of each memory cell string while the GIDL erasing operation are performed to the plurality of the first pages comprising:

applying an erase voltage to the dummy word line, the plurality of the second word lines, the ground selection line, and the common source line.

9. The erase method for the memory device according to claim 4, inhibiting the plurality of the first pages and the dummy cells of each memory cell string while the GIDL erasing operation are performed to the plurality of the second pages comprising:

applying the erase voltage to the dummy word line, the plurality of the first word lines, the string selection line, and bit lines while the GIDL erasing operation are performed to the plurality of the second pages.

10. A memory device, comprising:

a memory block, wherein the memory block comprises a plurality of memory cell strings, the plurality of the memory cell strings including a plurality of string selection transistors, a plurality of first-part memory cells, a plurality of dummy cells, a plurality of second-part memory cells, and a plurality of ground selection transistors, wherein each of the plurality of the string selection transistors, each of the plurality of the first-part memory cells, each of the plurality of the dummy cells, each of the plurality of the second-part memory cells, and each of the plurality of the ground selection transistors are connected in series to construct each memory cell string, each of the plurality of the dummy cells are disposed between one of the plurality of the first-part memory cells and one of the plurality of the second-part memory cells, wherein the first-part memory cells on each memory string connected to a plurality of first word lines respectively are constructed as a plurality of first pages, and the second-part memory cells on each memory string connected to a plurality of second word lines are constructed as a plurality of second pages;

a memory controller, coupled to the memory block to:

performing a program operation to one of the plurality of the first pages as a selected first page;

performing the program operation to one of the plurality of the second pages as a selected second page;

performing a gate induced drain leakage (GIDL) erasing operation to the plurality of the first pages;

inhibiting the plurality of the second pages and the dummy cells of each memory cell string while the GIDL erasing operation are performed to the plurality of the first pages;

performing the GIDL erasing operation to the plurality of the second pages; and inhibiting the plurality of the first pages and the dummy cells of each memory cell string while the GIDL erasing operation are performed to the plurality of the second pages, wherein, after the GIDL operation to the plurality of the first pages and the GIDL operation to the plurality of the second pages, all the first memory cells in a specific memory cell string are the type-1 erase bit or the type-2 erase bit, all the second memory cells in the specific memory cell string are the type-1 erase bit or the type-2 erase bit, and an erase bit type of the first memory cells and an erase bit type of the second memory cells has 0.5 inter-hamming distance.

11. The memory device according to claim 10, wherein the memory controller further to:

correspondingly generating physically unclonable function (PUF) data according to the plurality of the first memory cells and the plurality of the second memory cells randomly classified into the type-1 erase bit or the type-2 erase bit in the plurality of the memory cell strings.

12. The memory device according to claim 10, wherein the memory controller further to:

performing a read operation to the selected first page to obtain a first PUF data; and performing the read operation to the selected second page to obtain a second PUF data.

13. The memory device according to claim 10, wherein the dummy cells on each memory string are connected to a dummy word line, the plurality of the string selection transistors are connected to a string selection line, the plurality of the ground selection transistors are connected to a ground selection line, each memory cell string is coupled to a corresponding bit line through a corresponding string selection transistor, and, each memory cell string is coupled to a common source line through a corresponding ground selection transistor.

14. The memory device according to claim 13, wherein the memory controller performs the GIDL erasing operation to the plurality of the first pages comprising:

applying an erase voltage to bit lines;

applying a string selection line erase voltage to the string selection line, wherein a voltage difference between the erase voltage and the string selection line erase voltage is less than or equal to a predetermined voltage difference; and applying a word line erase voltage to the first word lines.

15. The memory device according to claim 14, wherein the predetermined voltage difference ranges from 0 volt to 5 volts.

16. The memory device according to claim 13, wherein the memory controller performs the GIDL erasing operation to the plurality of the second pages comprising:

applying an erase voltage to the common source line;

applying a ground selection line erase voltage to the ground selection line, wherein a voltage difference between the erase voltage and the ground selection line erase voltage is less than or equal to a predetermined voltage difference; and applying a word line erase voltage to the second word lines.

17. The memory device according to claim 13, wherein the memory controller inhibits the plurality of the second pages and the dummy cells of each memory cell string while the GIDL erasing operation are performed to the plurality of the first pages comprising:

applying an erase voltage to the dummy word line, the plurality of the second word lines, the ground selection line, and the common source line.

18. The memory device according to claim 13, wherein the memory controller inhibits the plurality of the first pages and the dummy cells of each memory cell string while the GIDL erasing operation are performed to the plurality of the second pages comprising:

applying the erase voltage to the dummy word line, the plurality of the first word lines, the string selection line, and bit lines while the GIDL erasing operation are performed to the plurality of the second pages.

* * * * *